United States Patent [19]

Dorinski et al.

[11] Patent Number: 5,031,027
[45] Date of Patent: Jul. 9, 1991

[54] SHIELDED ELECTRICAL CIRCUIT

[75] Inventors: Dale W. Dorinski, Coral Springs; Barry M. Miles, Plantation; David E. Reiff, Ft. Lauderdale, all of Fla.

[73] Assignee: Motorola, Inc., Schaumburg, Ill.

[21] Appl. No.: 552,039

[22] Filed: Jul. 13, 1990

[51] Int. Cl.$^5$ .............................................. H01L 23/02
[52] U.S. Cl. ................................... 357/74; 357/75; 357/84
[58] Field of Search .............................. 357/74, 75, 84

[56] References Cited

U.S. PATENT DOCUMENTS

| | | | |
|---|---|---|---|
| 3,614,546 | 10/1971 | Avins | 357/84 |
| 3,749,983 | 7/1973 | Beriger | 357/75 |
| 3,754,170 | 8/1973 | Tsuda | 357/84 |
| 4,394,707 | 7/1983 | Consoli . | |
| 4,651,312 | 3/1987 | Honma et al. . | |
| 4,727,410 | 2/1988 | Higgins, III . | |
| 4,742,183 | 5/1988 | Soloway et al. . | |
| 4,942,380 | 7/1990 | Bradford et al. | 335/301 |
| 4,958,260 | 9/1990 | Kobayashi et al. | 361/398 |

FOREIGN PATENT DOCUMENTS 59-86925  5/1984  Japan .

Primary Examiner—Eugene R. LaRoche
Assistant Examiner—R. Ratliff
Attorney, Agent, or Firm—Daniel K. Nichols

[57] ABSTRACT

A flexible substrate (100) carries circuitry (102) in one area of the substrate and other portions of the substrate are at least partially covered with conductive material (206) to provide a ground plane. The substrate is folded about the circuitry to form an enclosure shielding the circuit.

16 Claims, 2 Drawing Sheets

SHIELDED ELECTRICAL CIRCUIT

TECHNICAL FIELD

This invention relates generally to electrical circuits, and more specifically to electrical circuits that are sensitive to interference from electromagnetic radiation, and is particularly directed toward a means of shielding an electrical circuit from sources of electromagnetic radiation.

BACKGROUND

Certain electrical circuits, in particular those circuits that amplify or otherwise process electrical signals, are sensitive to electromagnetic interference. This interference can originate from many sources, and is common in the everyday operating environment of consumer and industrial electronics. Interfering signals can cause numerous problems, ranging from relatively minor inconveniences (such as distortion in an audio signal), to significant problems such as malfunction of a computer or other deivce. In order to eliminate this interference, a conductive metal cover is typically placed around the sensitive circuitry to shield the circuitry by conducting the interference to ground. In this way, the metal cover effectively filters out all unwanted signals and provides an electrically "clean" environment around the circuit.

Conventional shielding methods consist of placing the circuit into a metal "can" (enclosure) and attaching a cover to provide complete electromagnetic isolation. Regrettably, the attachment of this can and cover increases material costs, increases labor costs, increases the complexity of the finished product, and reduces overall mechanical reliability.

Generally a separate shield system requires at least one, and usually two additional parts. These parts are typically custom designed and fabricated, requiring the added expense of designing the parts, designing the tooling necessary to fabricate the parts, and manufacturing the parts. These costs are not trival, and typically run as much as 10-100% of the cost of the circuit being shielded. In certain situations, provision must be made to electrically isolate the interior of the metal enclosure from other areas of the circuit in order to prevent shorting or otherwise damaging the circuit. To do this, an insulating material must be placed between the shield and the circuit, which requires additional material and increases design and assembly costs.

The assembly of these additional parts used in conventional shielding practice requires significant time and space on the factory floor, and as such, further increases the cost of the finished circuit. Because nearly all of the prior shielding mechanisms are unique shapes and sizes, assembly is normally performed manually, leading to higher costs and lower quality than if performed by machines in an automated manufacturing environment.

In certain cases, the circuitry must be rigidly mounted in the metal shield to prevent unwanted distortion of the signal from mechanical microphonics. Such rigid mounting gives rise to unwanted mechanical stresses when the finished unit is exposed to thermal excursions, since the circuit material and the shielding material are made from two distinct materials, having unique and differing coefficients of thermal expansion. These stresses can result in mechanical distortion of the circuit or shield, or even to catastrophic failure of the circuit due to a discontinuous electrical connection between the circuit and the shield.

SUMMARY OF THE INVENTION

Briefly, according to the invention, a flexible substrate has circuitry formed in one area, while other portions of the substrate are at least partially covered with conductive material to provide a ground plane (electromagnetic shield). The flexible substrate is folded about the circuitry to form an enclosure, which is sealed by means of soldering, welding or adhesively bonding to form a shield around the circuit.

DETAILED DESCRIPTION OF THE PREFERRED EMBODIMENT

Figure 1:
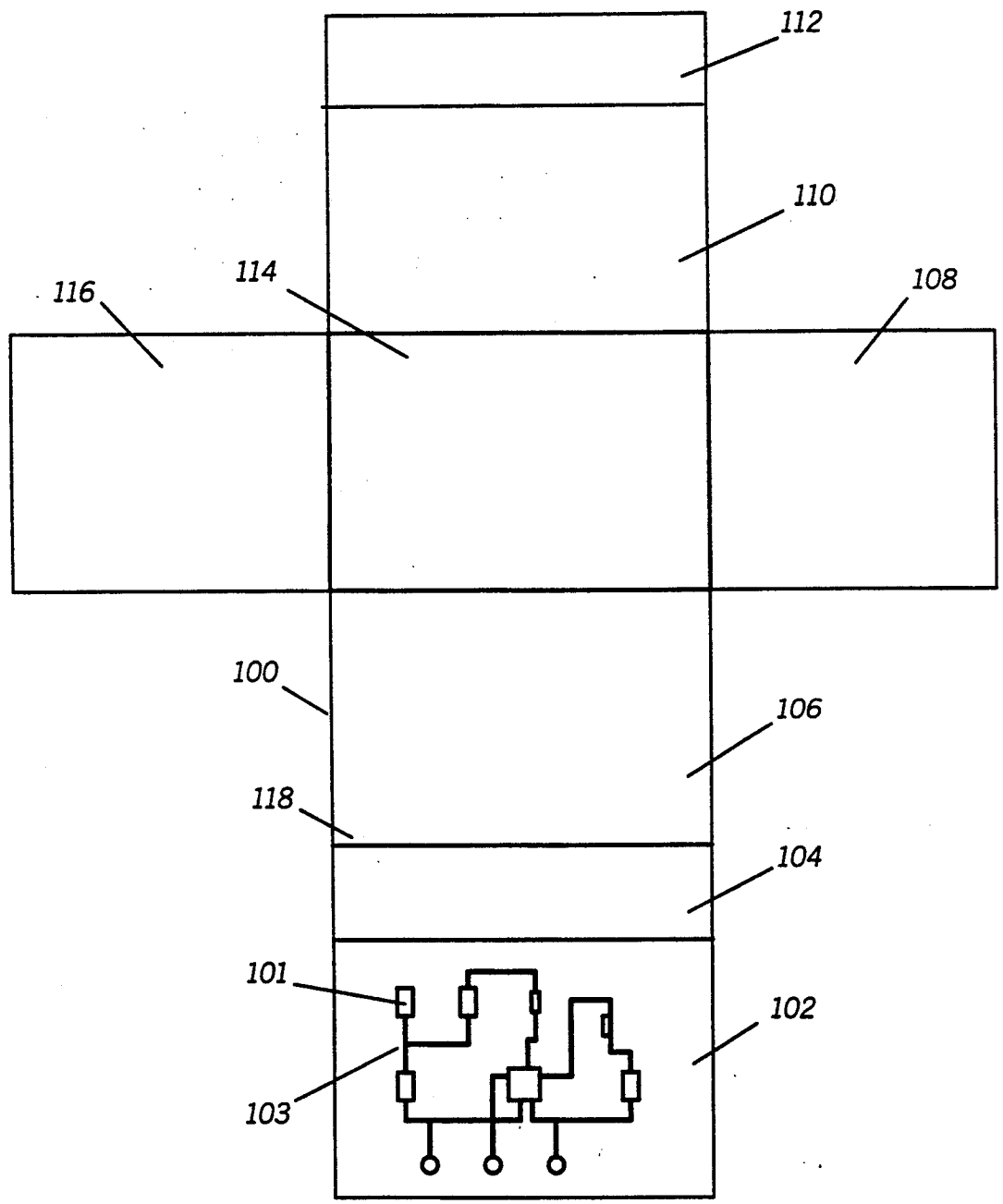
FIG. 1 is an illustration of a circuit carrying flexible substrate in accordance with the invention prior to being assembled and folded.

Referring to FIG. 1, flexible circuit carrying substrate 100 preferably comprising a flat sheet of plastic or other dielectric material is formed into the shape of an unfolded enclosure. The preferred embodiment employs Ultem ®2310, an engineering thermoplastic resin from General Electric Plastics, chemically known as polyetherimide, as the dielectric material. However, other equivalent materials such as polyethersulfone, polyetheretherketone, thermoplastic polyimides, liquid crystal polymers, polyphenylenesulfide, etc. may also be used. Each of the exterior faces of enclosure 100 are attached to an active circuit layer 102 via hinges 118. The hinge is preferably an integral 'living' hinge, that is it is not a separate piece of material, but a thin section of the flat sheet 100 that can be easily bent without breaking. The formation of such living hinges is known by those skilled in the art.

Depending on the desired configuration of the completed enclosure, flexible circuit carrying substrate 100 may have 6 or more members connected by hinges 118. In the preferred embodiment, an active circuitry layer 102 consists of conventionally formed interconnecting circuit traces 103 and components 101 soldered or otherwise coupled to circuit traces 103. The lower front portion 104 of the enclosure is coupled to the active circuit layer 102 by means fo the hinge 118. Other members (106-116) of the enclosure are also preferably coupled to each other by means of hinges 118, and are arranged so as to provide an enclosure when properly folded around active circuitry layer 102 (see FIG. 2).

Figure 2:
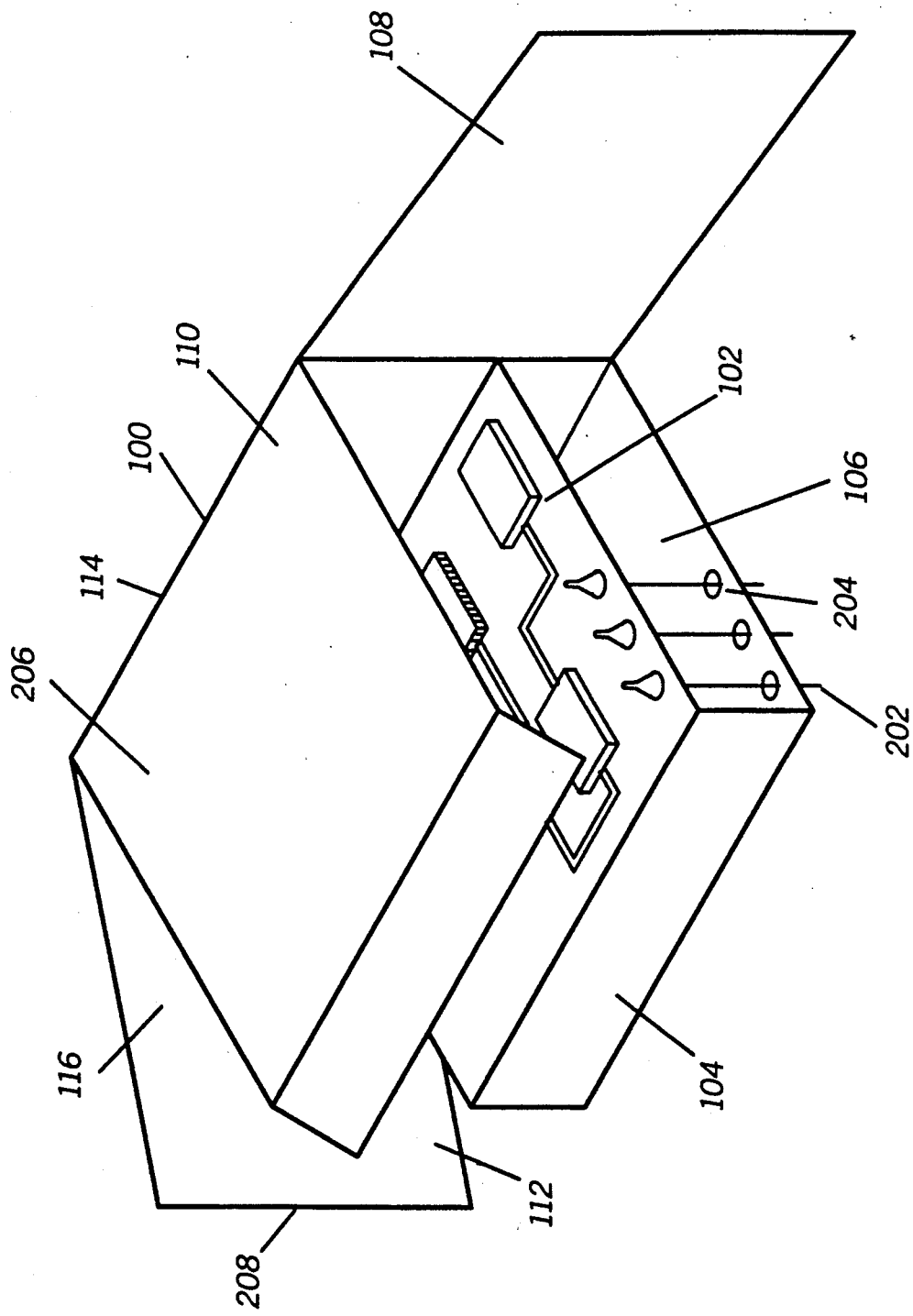
FIG. 2 is an isometric illustration of the circuit carrying flexible substrate of FIG. 1 after components are added and the substrate is folded into an enclosure.

The first step of the assembly of the circuit enclosure is achieved by placing and soldering components 101 onto the active circuitry layer 102 by reflow, wave, or hand soldering. This is easily achieved using conventional techniques due to the planar nature of the circuitry/enclosure at this point. After soldering, the enclosure is folded about hinges 118 into an enclosure as shown in FIG. 2. Connection of the circuit to other external circuitry is achieved by means of leads 202 extending through corresponding apertures 204, or by other methods know to those skilled in the art. According to the invention, the diameter of apertures 204 is large enough to allow leads 202 to pass through unimpeded, but with a minimum of space around leads 202 so that no unwanted electromagnetic interference can pass through the apertures. The exterior of enclosure 100 is preferably covered with a continuous metal covering 206 that provides the electromagnetic shielding. Thus, when folded and sealed, the interior of enclosure 100 consists of an insulating layer that serves to provide a dielectric between the circuitry and a ground plane 206 on the exterior of enclosure 100. In order to provide a continuous metal shield and to hold the folded enclosure in a fixed position, the enclosure 100 is preferably sealed by soldering, welding, or bonding edges 208 together with a conventional conductive adhesive. In the preferred embodiment, the edges 208 are soldered together, but any of the above or alternate methods may be used as long as the members 140-116 of the enclosure 100 are electrically connected to each other when folded. A continuous shield is thus formed around the circuit, preventing the emission or ingress of electromagnetic radiation.

In a second embodiment, the metal coating may be be located on the interior of enclosure 100. When folded, the various faces 104-116 of enclosure 100 are electrically connected to each other, and the enclosure 100 can be maintained in a folded position by adhesive bonding, thereby eliminating the need to solder or weld edges 208. This provides a dielectric layer on the exterior of the enclosure that prevents the circuitry from shorting to adjacent components or systems.

What is claimed is:

1. A shielded electrical circuit, comprising:
   an electrical circuit formed upon a portion of a circuit carrying,
   the circuit carrying substrate having flexible portions, other portions of the circuit carrying substrate being at least partially covered with conductive material and folding to form an enclosure around the electrical circuit for electrically shielding the electrical circuit so as to prevent the ingress or egress of radio frequency interference or eletromagnetic interference.

2. The shielded electrical circuit of claim 1, wherein the enclosure is folded by means of living hinges.

3. The shielded electrical circuit of claim 1, wherein substantially all exterior surfaces of the enclosure are at least partially covered with a conductive material.

4. The shielded electrical circuit of claim 1, wherein substantially all interior surfaces of the enclosure are at least partially covered with a conductive material.

5. The shielded electrical circuit of claim 1, wherein the circuit carrying substrate is constructed and arranged to accommodate portions of the electrical circuit on opposing sides of the substrate.

6. The shielded electrical circuit of claim 1, wherein the edges of the enclosure are sealed by soldering.

7. The shielded electrical circuit of claim 1, wherein the edges of the enclosure are sealed by welding.

8. The shielded electrical circuit of claim 1, wherein the edges of the enclosure are sealed by means of a conductive adhesive.

9. The shielded electrical circuit of claim 4, wherein the edges of the enclosure are sealed by means of an adhesive.

10. A shielded electrical circuit, comprising:
    a circuit carrying substrate having flexible portions:
    an electrical circuit constructed and arranged to accommodate electrical circuitry on opposing sides of a portion of the circuit carrying substrate;
    an electrical shield formed by folding other portions of the circuit carrying substrate that are at least partially covered with a layer of conductive material around the electrical circuit so as to prevent the ingress or egress of radio frequency interference or electromagnetic interference, the enclosure being folded by means of living hinges.

11. The shielded electrical circuit of claim 10, wherein substantially all exterior surfaces of the enclosure are at least partially covered with a conductive material.

12. The shielded electrical circuit of claim 10, wherein substantially all interior surfaces of the enclosure are at least partially covered with a conductive material.

13. The shielded electrical circuit of claim 10, wherein substantially all edges of the enclosure are sealed by soldering.

14. The shielded electrical circuit of claim 10, wherein substantially all edges of the enclosure are sealed by welding.

15. The shielded electrical circuit of claim 10, wherein substantially all edges of the enclosure are sealed by means of a conductive adhesive.

16. The shielded electrical circuit of claim 13, wherein substantially all edges of the enclosure are sealed by means of an adhesive.

* * * * *

UNITED STATES PATENT AND TRADEMARK OFFICE
CERTIFICATE OF CORRECTION

PATENT NO. : 5,031,027
DATED : July 9, 1991
INVENTOR(S) : Dale W. Dorinski, et al It is certified that error appears in the above-identified patent and that said Letters Patent is hereby corrected as shown below:

In claim 16, column 4, line 44, delete "13" and insert therefor -- 12 --.

Signed and Sealed this

Twenty-sixth Day of January, 1993

Attest:

STEPHEN G. KUNIN

*Attesting Officer*  *Acting Commissioner of Patents and Trademarks*